US012695048B2

(12) United States Patent　　　　(10) Patent No.:　US 12,695,048 B2

Sun et al.　　　　　　　　　　　　(45) Date of Patent:　　Jul. 28, 2026

(54) MANAGING BEAM POWER EFFECTS BY VARYING BASE EMISSIVITY

(71) Applicant: Applied Materials, Inc., Santa Clara, CA (US)

(72) Inventors: Dawei Sun, Lynnfield, MA (US); Eric D. Hermanson, Georgetown, MA (US); Benjamin E. Heneveld, Hiram, ME (US)

(73) Assignee: Applied Materials, Inc., Santa Clara, CA (US)

( * ) Notice: Subject to any disclaimer, the term of this patent is extended or adjusted under 35 U.S.C. 154(b) by 694 days.

(21) Appl. No.: 17/943,753

(22) Filed: Sep. 13, 2022

(65) Prior Publication Data

US 2024/0087839 A1　　Mar. 14, 2024

(51) Int. Cl.
| | |
|---|---|
| *H01J 37/20* | (2006.01) |
| *G02F 1/163* | (2006.01) |
| *H01J 37/02* | (2006.01) |
| *H01J 37/317* | (2006.01) |
| *H05B 1/02* | (2006.01) |

(Continued)

(52) U.S. Cl.
CPC .............. *H01J 37/20* (2013.01); *G02F 1/163* (2013.01); *H01J 37/023* (2013.01); *H05B 1/0233* (2013.01); *H01J 37/3171* (2013.01); *H01J 2237/002* (2013.01); *H01J 2237/2007* (2013.01); *H05B 3/28* (2013.01); *H10P 72/722* (2026.01)

(58) Field of Classification Search
None
See application file for complete search history.

(56) References Cited

U.S. PATENT DOCUMENTS

| | | | |
|---|---|---|---|
| 4,619,030 | A | 10/1986 | Marwick et al. |
| 2014/0318455 | A1 | 10/2014 | Blake et al. |
| 2015/0376760 | A1 | 12/2015 | Naim et al. |

(Continued)

FOREIGN PATENT DOCUMENTS

| | | | | |
|---|---|---|---|---|
| EP | 2362415 A1 | * | 8/2011 | .......... H10P 72/0604 |
| EP | 1909308 B1 | * | 2/2013 | .............. H10P 72/72 |

(Continued)

OTHER PUBLICATIONS

International Search Report and Written Opinion mailed Dec. 11, 2023 in corresponding PCT application No. PCT/US2023/030706.

*Primary Examiner* — Andrew Smyth

(74) *Attorney, Agent, or Firm* — Nields, Lemack & Frame, LLC

(57) ABSTRACT

A workpiece mounting system comprising a chuck and a base is disclosed. The emissivity of the base is increased to allow more heat transfer from the chuck to the base. In some embodiments, the emissivity of the base may be controllable so that for ion beams with lower power levels, the emissivity remains low, enabling the chuck to reach the desired temperature quickly. For ion beams with higher power levels, the emissivity may increase to allow more heat transfer to the base, allowing the chuck to maintain the desired temperature. High emissivity coatings may be applied to the top surface of the base. In other embodiments, a set of movable shields may be disposed between the chuck and the base. The position of the shields may be a function of the power level of the incoming ion beam.

17 Claims, 4 Drawing Sheets

(51) Int. Cl.
    *H05B 3/28*        (2006.01)
    *H10P 72/72*     (2026.01)

(56)            References Cited

U.S. PATENT DOCUMENTS

| | | | |
|---|---|---|---|
| 2017/0133258 | A1 | 5/2017 | Miwa et al. |
| 2018/0197761 | A1* | 7/2018 | Ferrara ............... H10P 72/0432 |
| 2020/0176282 | A1 | 6/2020 | Iijima et al. |
| 2020/0395197 | A1 | 12/2020 | Garcia de Gorordo et al. |
| 2020/0411354 | A1 | 12/2020 | Rao et al. |

FOREIGN PATENT DOCUMENTS

| | | | | |
|---|---|---|---|---|
| JP | 61-93825 | A | | 5/1986 |
| JP | 2005064062 | A | * | 3/2005 |
| JP | 2010-40644 | A | | 2/2010 |
| JP | 6527084 | B2 | | 6/2019 |
| JP | 2020-514973 | A | | 5/2020 |
| JP | 2022-38906 | A | | 3/2022 |
| KR | 2015-0070680 | A | | 6/2015 |
| TW | 202129830 | A | | 8/2021 |
| TW | I737059 | B | * | 8/2021 .......... H10P 72/0602 |
| WO | WO-2020090163 | A1 | * | 5/2020 .......... H10P 72/7611 |
| WO | 2021/170209 | A1 | | 9/2021 |

* cited by examiner

MANAGING BEAM POWER EFFECTS BY VARYING BASE EMISSIVITY

FIELD

Embodiments of the present disclosure relate to systems for varying the emissivity of the base to improve heat transfer from the electrostatic chuck to the base and allow higher power implants.

BACKGROUND

The fabrication of a semiconductor device involves a plurality of discrete and complex processes. The semiconductor workpiece typically undergoes many processes during the fabrication process. As a workpiece is being processed, the workpiece is typically clamped to a chuck. This clamping may be mechanical or electrostatic in nature. The electrostatic chuck traditionally consists of a plurality of layers. The top layer, also referred to as the top dielectric layer, contacts the workpiece, and is made of an electrically insulating or semiconducting material, such that it produces the electrostatic field without creating a short circuit. To create the electrostatic force, a plurality of electrodes may be disposed beneath the top dielectric layer. The plurality of electrodes is constructed from an electrically conductive material, such as a metal.

In certain applications, such as the fabrication of power devices, implants at elevated temperatures may be beneficial. To raise the temperature of the workpiece, the workpiece is typically heated by contact, such as through the use of a gas trapped between the workpiece and the chuck, such as when the workpiece is held in place by electrostatic forces. The workpiece may also be directly heated by the chuck. In both embodiments, heat is applied to the lower surface of the workpiece by the chuck. To achieve these elevated temperatures, the chuck is maintained at an elevated temperature, typically through the use of embedded resistive heating elements.

At lower beam power levels, the chuck is able to dissipate heat at a faster rate than it is being provided by the ion beam. At these beam power levels, the heating elements are used to maintain the desired temperature of the chuck. However, at higher beam power levels, the chuck cannot dissipate the heat fast enough, such that the temperature of the workpiece cannot be controlled. This phenomenon is referred to as thermal runaway and may limit the beam power levels that may be used. By using lower beam power levels than desired, implants times are extended, reducing throughput.

Therefore, it would be advantageous if there was a system that could dissipate the energy supplied by the ion beam so that higher beam power levels may be utilized. Further, it would be beneficial if this system was useful for both low power levels and high power levels.

SUMMARY

A workpiece mounting system comprising a chuck and a base is disclosed. The emissivity of the base is increased to allow more heat transfer from the chuck to the base. In some embodiments, the emissivity of the base may be controllable so that for ion beams with lower power levels, the emissivity remains low, enabling the chuck to reach the desired temperature quickly. For ion beams with higher power levels, the emissivity may increase to allow more heat transfer to the base, allowing the chuck to maintain the desired temperature. High emissivity coatings may be applied to the top surface of the base. In other embodiments, a set of movable shields may be disposed between the chuck and the base. The position of the shields may be a function of the power level of the incoming ion beam.

According to one embodiment, a system for mounting and heating a workpiece is disclosed. The system comprises an electrostatic chuck; and a base, separate from the electrostatic chuck; wherein a material having an emissivity different from the base, is disposed on a top surface of the base. In some embodiments, the material comprises a high emissivity coating. In certain embodiments, the high emissivity coating has an emissivity of 0.4 or greater. In certain embodiments, the high emissivity coating has an emissivity of 0.6 or greater. In some embodiments, the high emissivity coating comprises at least one of anodized aluminum, anodized titanium, SiC, alumina, graphite, silicon, silicon dioxide, nichrome, and ceramic coatings. In certain embodiments, the material comprises an electrochromic material. In some embodiments, the electrochromic material comprises an electrochromic glass. In certain embodiments, the electrochromic glass has a transmissivity that changes by at least 30%, depending on a voltage applied to the electrochromic glass.

According to another embodiment, a system for mounting and heating a workpiece is disclosed. The system comprises an electrostatic chuck; a base, separate from the electrostatic chuck; and a controller configured to modify an amount of heat transfer between the electrostatic chuck and the base, based on a power level of an incoming ion beam. In some embodiments, an electrochromic material is disposed on a top surface of the base, and the system further comprises an electrochromic power supply in communication with the electrochromic material and the controller, wherein the controller controls a voltage supplied to the electrochromic material by the electrochromic power supply. In some embodiments, an emissivity of the electrochromic material is greater than the emissivity of the top surface of the base. In some embodiments, a transmissivity of the electrochromic material is at a first value when a low power ion beam is used and a second value, lower than the first value, when a high power ion beam is used. In certain embodiments, when the transmissivity is the second value, the amount of heat transfer between the electrostatic chuck and the base is greater than the amount of heat transfer when the transmissivity is the first value. In some embodiments, the system further comprises movable shields disposed between the electrostatic chuck and the base. In certain embodiments, a top surface of the base is coated with a high emissivity material, having an emissivity of 0.4 or more. In certain embodiments, the movable shields are made of a material having an emissivity less than the emissivity of the high emissivity material. In some embodiments, the movable shields are in a closed position when a low power ion beam is used and in an open position when a high power ion beam is used, wherein in the closed position, the movable shields are positioned such that a top surface of the movable shields is parallel to a bottom surface of the electrostatic chuck. In some embodiments, the movable shields are in a closed position when a low power ion beam is used and in an open position when a high power ion beam is used, wherein in the closed position, the movable shields are positioned such that more than 80% of heat radiated by the electrostatic chuck is blocked by the movable shields so the heat does not travel directly to a top surface of the base from the electrostatic chuck.

BRIEF DESCRIPTION OF THE FIGURES

For a better understanding of the present disclosure, reference is made to the accompanying drawings, which are incorporated herein by reference and in which.

DETAILED DESCRIPTION

As described above, in many applications, it may be advantageous to heat the workpiece while the workpiece is clamped to an electrostatic chuck. Traditionally, this heating is performed using conduction, where the heat contained in the electrostatic chuck is transferred to the workpiece, often through the use of back side gas.

Figure 1:
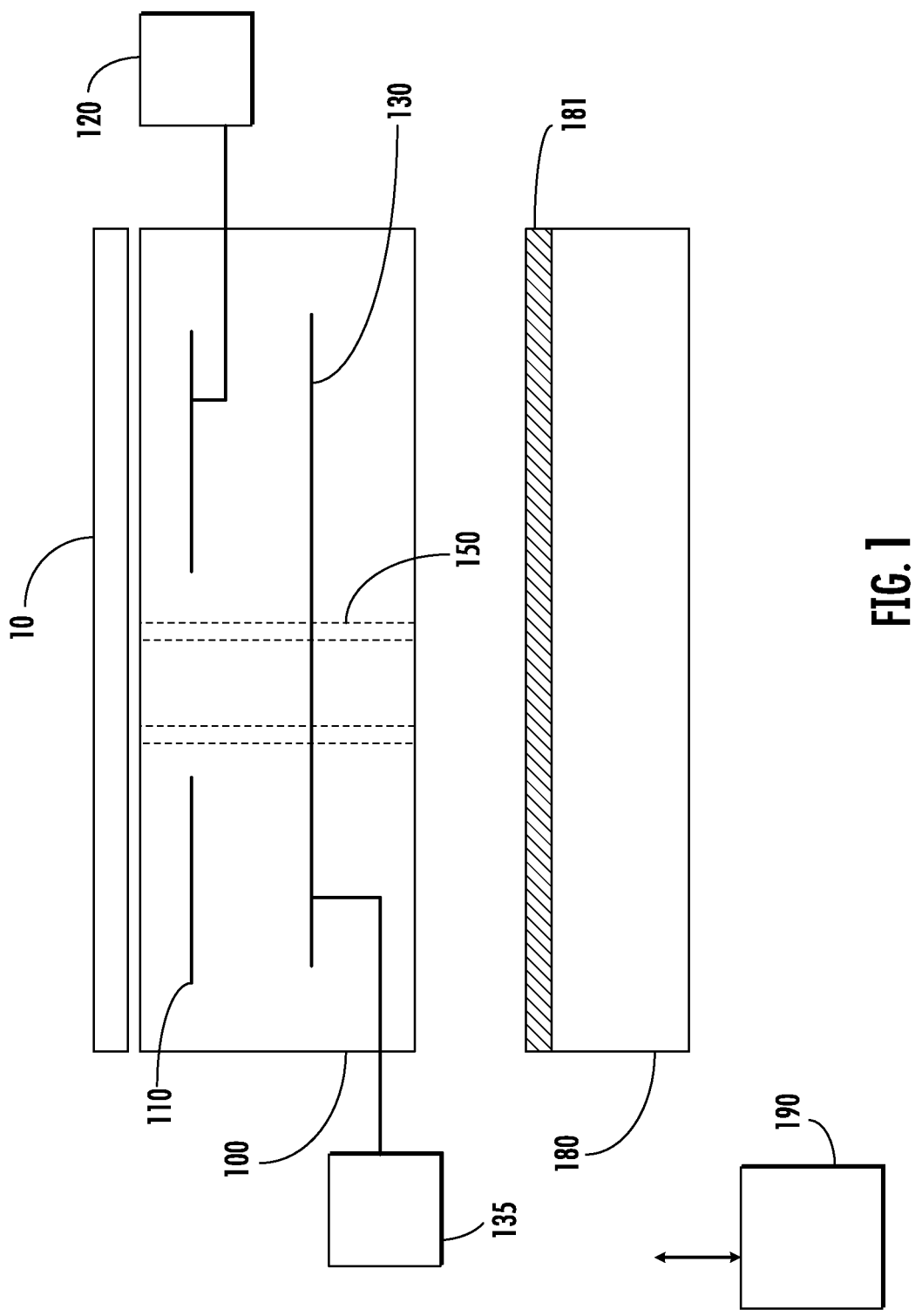
FIG. 1 is a side view of the chuck and the base according to one embodiment.

Several embodiments of a system for mounting and heating a workpiece are disclosed. A first embodiment is shown in FIG. 1.

The chuck, which may be an electrostatic chuck 100, may include one or more electrodes 110 disposed therein. These electrodes 110 are in communication with an electrode power supply 120. The electrode power supply 120 may supply a DC or AC voltage to the electrodes 110. The frequency and amplitude of the voltage supplied to the electrodes 110 may be dictated by the design and are not limited by this disclosure. In certain embodiments, the electrodes 110 may be arranged in pairs, where voltages of opposite polarity are provided to the pair.

The electrostatic chuck 100 may also include heaters 130 embedded in the electrostatic chuck 100. These heaters 130 may be used to heat the electrostatic chuck 100 to a desired temperature. These heaters 130 may be resistive elements, where current is passed through the heaters 130 to increase their temperature. The heaters 130 may be in communication with a heating power supply 135.

Backside gas channels may pass through the electrostatic chuck 100 terminating on the top surface of the electrostatic chuck 100. The backside gas channels 150 may be in communication with a source of back side gas. This backside gas enables the conduction of heat between the electrostatic chuck 100 and the workpiece 10.

The system also includes a base 180, which is typically cooled. The base 180 may be constructed of a metal, such as aluminum. The base 180 may be water cooled. The base 180 may be maintained at a lower temperature than the electrostatic chuck 100. The electrostatic chuck 100 may be separated from the base 180 using standoffs or another mechanism, especially for high temperature implants, where proper thermal management is critical. The standoffs allow reasonable temperature gradients and acceptable thermal stresses to be maintained in the electrostatic chuck 100 while keeping the wafers at high temperature, such as, for example, greater than 300° C. In some embodiments, the electrostatic chuck 100 and the base 180 are separated by a distance of, for example, between 0.5 mm and 50 mm. In certain embodiments, the distance between the electrostatic chuck 100 and the base 180 may be between 1.0 mm and 10 mm. Of course, other dimensions may be used.

A controller 190 may be in communication with the electrode power supply 120 and heating power supply 135. The controller 190 has a processing unit and an associated memory device. This memory device contains the instructions, which, when executed by the processing unit, enable the system to perform the functions described herein. This memory device may be a non-volatile memory, such as a FLASH ROM, an electrically erasable ROM or other suitable devices. In other embodiments, the memory device may be a volatile memory, such as a RAM or DRAM. In certain embodiments, the controller 190 may be a general purpose computer, an embedded processor, or a specially designed microcontroller. The actual implementation of the controller 190 is not limited by this disclosure.

The heat transfer (Q) between the electrostatic chuck 100 and the base 180 is determined by the equation:

$$Q = A * \varepsilon_{eff} * \sigma * \left(T_{chuck}^4 - T_{base}^4\right) \tag{1}$$

wherein $\sigma$ is Stefan-Boltzmann constant, $$\varepsilon_{eff} = \cfrac{1}{\cfrac{1}{\varepsilon_{chuck}} + \cfrac{1}{\varepsilon_{base}} - 1}$$

which is the effective emissivity between the electrostatic chuck and the base, with $\varepsilon_{chuck}$ the emissivity of the electrostatic chuck and $\varepsilon_{base}$ the emissivity of the surface of the base 180, assuming the view factor between the electrostatic chuck and the base is 1. A is the surface area of the top surface of the base, and $T_{chuck}$ and $T_{base}$ are the temperatures of the electrostatic chuck 100 and the base 180, respectively.

As noted above, the base 180 is typically aluminum, which as an emissivity of roughly 0.1-0.2, depending on the surface finishing. Thus, if the emissivity of the base 180 is increased, more heat would be transferred to the base 180. In the embodiment shown in FIG. 1, the top surface of the base 180 has been coated with a high emissivity coating 181. This high emissivity coating 181 may be any material which controls the surface emissivity and also satisfies semiconductor processing constraints, such as anodized aluminum, anodized titanium, SiC, alumina, graphite, silicon, silicon dioxide, nichrome, ceramic coatings such as Cerablak™, and others. The coating methods may be but are not limited to atomic layer deposition (ALD), plasma vapor deposition (PVD), chemical vapor deposition (CVD), thermal spray, and others. To achieve higher emissivity, the coating thickness may be 2 µm or more, as long as good adhesion can be achieved between the high emissivity coating 181 and the base 180. The high emissivity coating 181 may be any coating that can be applied to the top surface of the base 180 which has an emissivity of at least 0.4. Such a coating may roughly double the amount of heat that is transferred to the base 180, depending on the emissivity of the chuck. In some embodiments, the high emissivity coating has an emissivity of at least 0.6. Such a coating may roughly triple the amount of heat that is transferred from the electrostatic chuck 100 to the base 180, depending on the emissivity of the chuck. The emissivity of the high emissivity coating 181 may be customized by changing the material selections or chemical composition of the coating to control the thermal energy emission and absorption. The coating emissivity is then controlled accordingly. The energy absorption of the base 180 can also be further controlled by changing its surface roughness, such as Ra>0.5 µm, which is an effective way to increase surface area, A, as stated in the Eq. (1). The increased roughness has also the added benefit of increasing the adhesion between the high emissivity coating 181 and the base 180.

Figure 2:
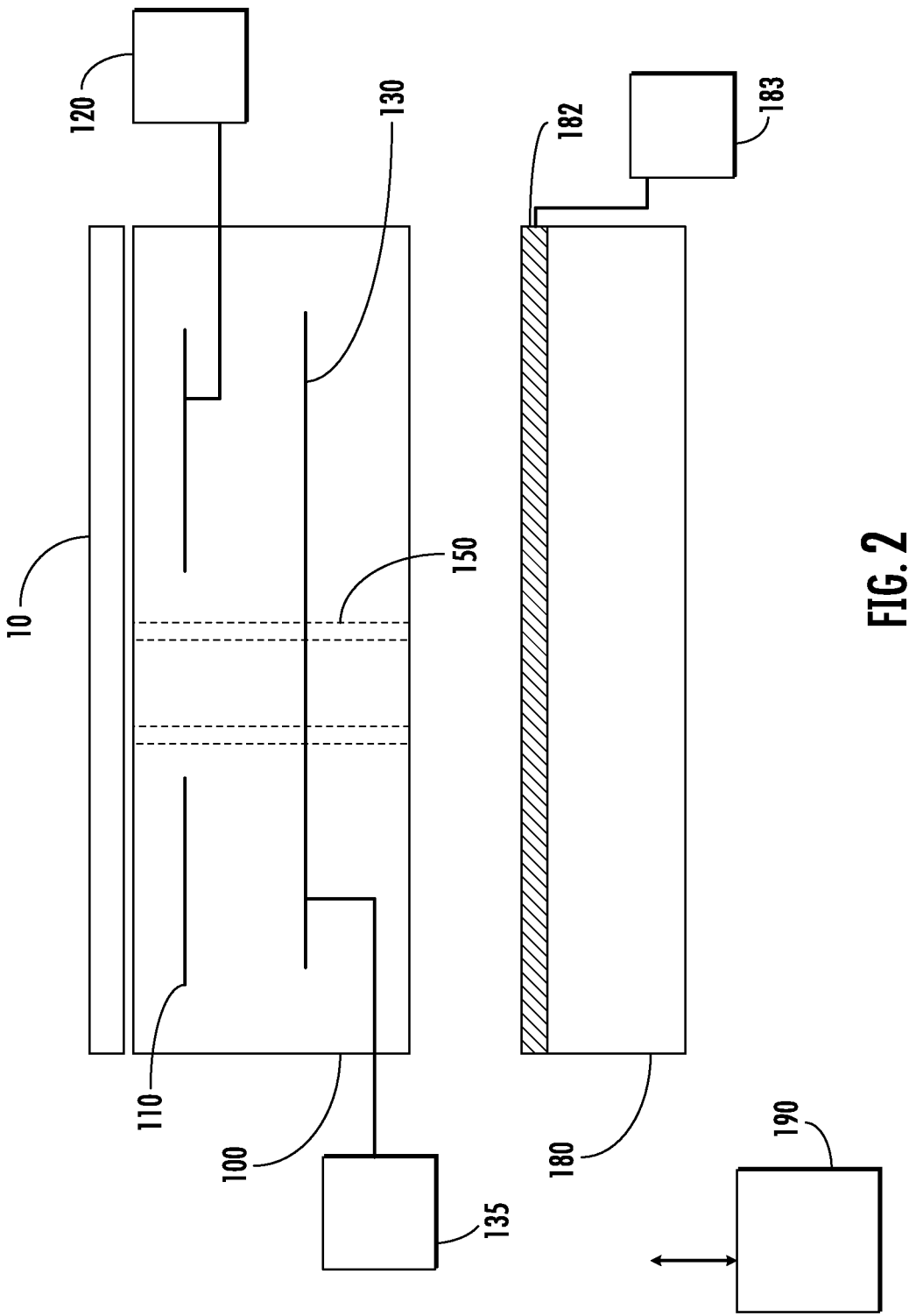
FIG. 2 is a side view of the chuck and the base according to another embodiment.

FIG. 2 shows a second embodiment. In this embodiment, the electrostatic chuck 100 is the same as described with respect to FIG. 1. The distance between the electrostatic chuck 100 and the base 180 may be as described above. In this embodiment, an electrochromic material 182, is applied to the top surface of the base 180. The electrochromic material 182 may have a thickness between 0.1 and 10 μm, although other thicknesses are also possible. The electrochromic material 182 may be in communication with an electrochromic power supply 183. In operation, the transmissivity of the electrochromic material 182 changes based on the voltage being provided by the electrochromic power supply 183. The electrochromic material 182 may be a switchable glass, also referred to as smart glass, or may be a different material. The electrochromic material 182 may include oxides of transition metals, such as Nbox, $WO_3$, $MoO_3$, $IrO_2$, NiO, and $V_2O_5$. In one specific embodiment, the electrochromic material 182 may be tin-doped indium (ITO) nanocrystals in niobium oxide glass. It is reported that by changing applied voltage from 1.5V to 4V, the light transmissivity of a glass containing ITO nanocrystals can change from ~60% to ~95%. In other words, there may be at least a 30% change in transmissivity, depending on the voltage applied to the electrochromic material 182. Of course, different voltages may be utilized. Additionally, the electrochromic material 182 typically has a much higher emissivity than aluminum, such as 0.9.

The controller 190 may be in communication with the electrochromic power supply 183. Thus, the controller 190 is capable of changing the transmissivity of the electrochromic material 182.

In this embodiment, the thermal energy exchange between the chuck and the base can be written as:

$$Q = \tag{2}$$
$$A * \varepsilon_{eff} * \tau * \sigma * \left(T_{chuck}^4 - T_{base}^4\right) + A * \varepsilon_{eff,2} * (1 - \tau) * \sigma * \left(T_{chuck}^4 - T_{base}^4\right)$$

where $\tau$ is transmission transmissivity, and $$\varepsilon_{eff,2} = \frac{1}{\dfrac{1}{\varepsilon_{chuck}} + \dfrac{1}{\varepsilon_{glass}} - 1}$$

the effective emissivity between the electrostatic chuck and the electrochromic material 182.

Thus, the first part of the equation represents the heat transfer between the electrostatic chuck and the base, while the second part of the equation represents the heat transfer between the electrostatic chuck and the electrochromic material 182. When high voltage, which may be for example 4V, is applied, the electrochromic material 182 becomes near transparent, i.e. $\tau \to 1$, and Eq. (2) is equivalent to Eq. (1). If the base retains its native surface, which may be $\varepsilon_{base}=0.2$, this configuration would represent a low emissivity configuration. When the voltage is lowered, the transmissivity $\tau$ can be lowered to 60%. In this scenario, Eq. (2) becomes a blend of heat transfer to a lower emissivity base ($\varepsilon_{base}=0.2$) and a high emissivity surface (($\varepsilon_{glass}=0.9$).

Thus, in the embodiments of FIGS. 1-2, the top surface of the base 180 is covered with a material which has an emissivity that is different from that of the base 180. That material may be a high emissivity coating 181, as described with respect to FIG. 1. Alternatively, that material may be an electrochromic material 182, as described with respect to FIG. 2. This material may have a higher emissivity than the top surface of the base 180.

Figure 3A:
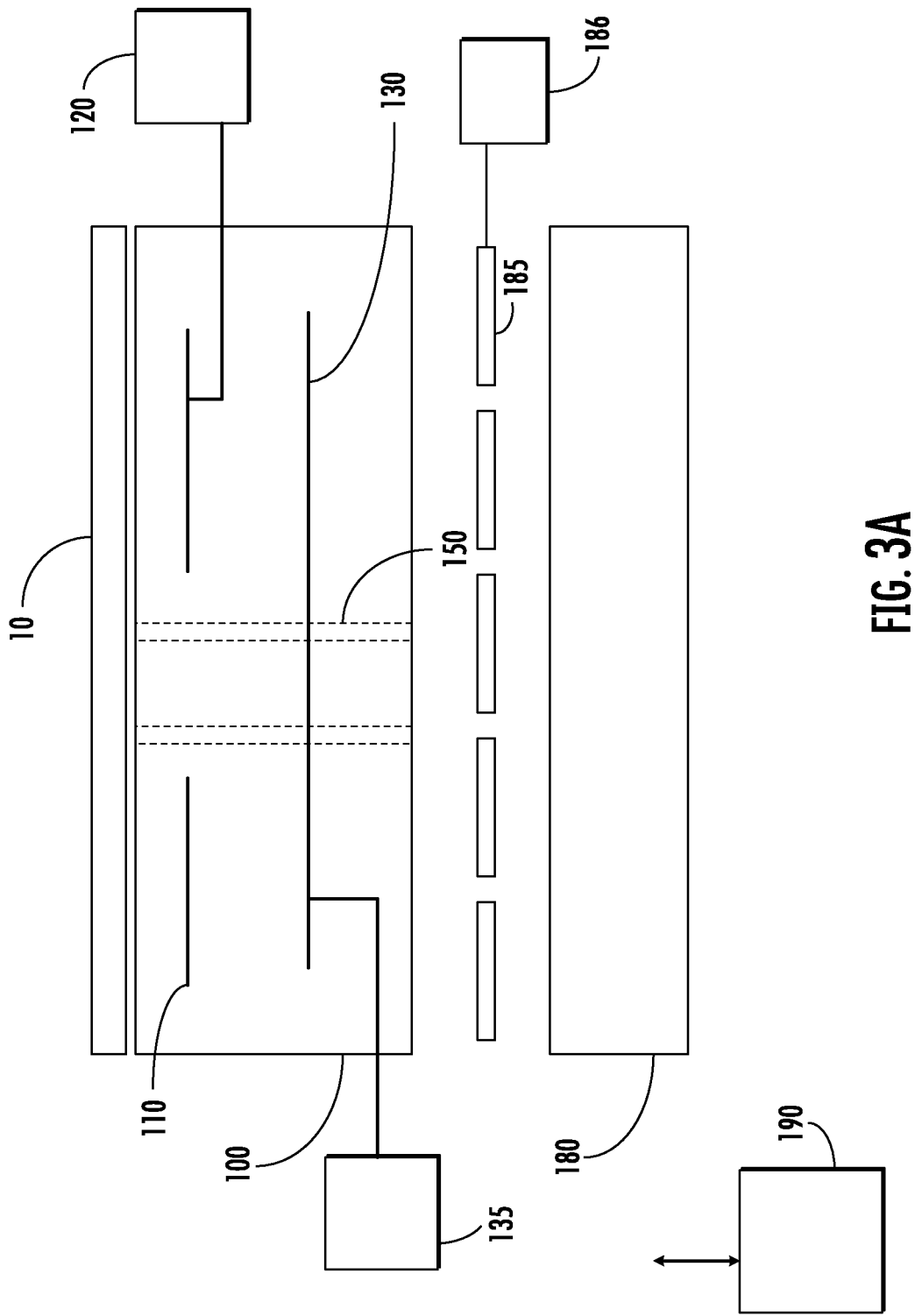
FIGS. 3A-B are side views of the chuck and the base in the closed and open positions, respectively, according to a third embodiment.
Figure 3B:
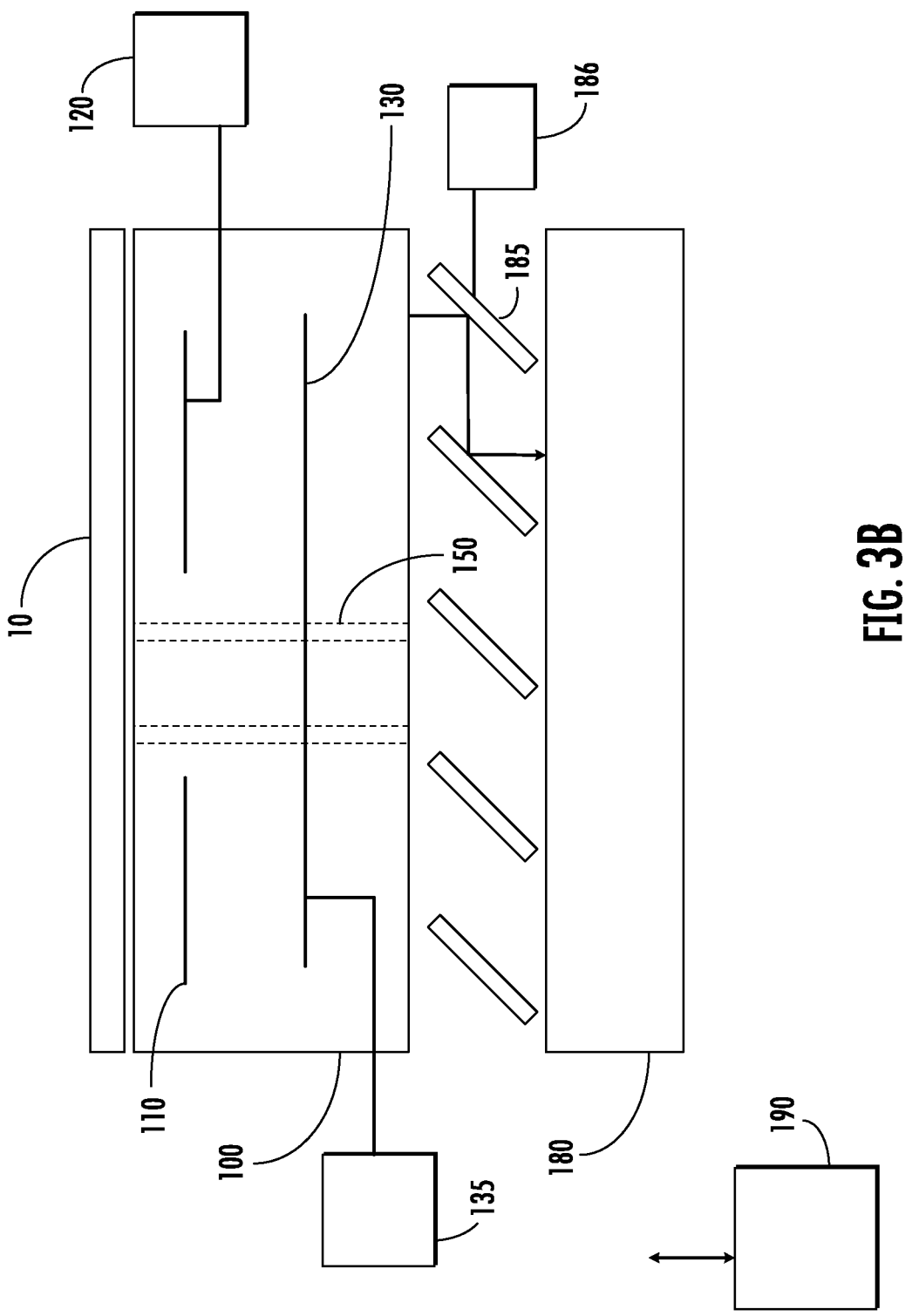

FIGS. 3A-3B show a third embodiment. In this embodiment, the electrostatic chuck 100 is the same as described with respect to FIG. 1. The distance between the electrostatic chuck 100 and the base 180 may be as described above. In this embodiment, one or more movable shields 185 are disposed between the base 180 and the electrostatic chuck 100. The movable shields 185 may be made of metal or another suitable material. Each of the movable shields 185 has a width, which is defined as the horizontal direction in FIG. 3A, a thickness, defined as the vertical direction in FIG. 3A, and a length, which is the direction into the page. The length of each of the movable shields 185 may be such that each is at least as long as the portion of the electrostatic chuck which it is disposed beneath. Further, the width of each of the movable shields 185 may be such that, when the plurality of movable shields are placed adjacent in the width direction, the combined width is at least as wide as the electrostatic chuck 100. The thickness of the movable shields may be substantially smaller than the width of each shield. For example, in some embodiments, the ratio of the width of the movable shields 185 to the thickness may be at least 5:1. In other embodiments, it may be 10:1 or more.

Further, the movable shields 185 are configured such that they are capable of pivoting about an axis, as shown in FIG. 3B. In some embodiments, the movable shields may be capable of pivoting at least 90°. A pivoting motor 186 may be in communication with the movable shields 185, allowing them to rotate from the closed position shown in FIG. 3A to an open position shown in FIG. 3B. The controller 190 may be in communication with the pivoting motor 186.

Further, the emissivity of the top surface of the movable shields, which is the surface closest to the electrostatic chuck 100, may be different from the emissivity of the bottom surface. In some embodiments, the emissivity of the top surface may be greater than that of the bottom surface. In other embodiments, the emissivity of the two surfaces is the same.

In some embodiments, the movable shields 185 may have low emissivity. In certain embodiments, the emissivity of the movable shields 185 may be 0.4 or less. In other embodiments, the emissivity of the movable shields 185 may be 0.2 or less. In other embodiments, the emissivity of the movable shields 185 may be 0.1 or less. When in the closed position, shown in FIG. 3A, the heat radiated by the electrostatic chuck 100 is mostly reflected back toward the chuck, allowing the chuck to retain more of its heat. In the closed position, the top surfaces of the movable shields 185 may be arranged in a plane that is parallel to the bottom surface of the electrostatic chuck 100. The top surface of each movable shield is defined as the side closest to the chuck when in the closed position. In the closed position, more than 80% of the heat radiated by the electrostatic chuck may be blocked by the movable shields 185 so it does not travel directly to the top surface of the base 180 from the chuck. In other embodiments, more than 90% of the heat is blocked. Since almost all heat is transferred first to the movable shields and then from the movable shields to the base, the effective emissivity between the electrostatic chuck 100 and the base 180 becomes:

$$\varepsilon_{eff,sh} = \cfrac{1}{\cfrac{1}{\varepsilon_{chuck}} + \cfrac{1}{\varepsilon_{base}} + \cfrac{2}{\varepsilon_{shield}} - 2} \qquad (3)$$

If $\varepsilon_{shield}$ is maintained in a range of <0.1, and the base has a high emissivity coating, such that the emissivity is at least 0.4, the effective emissivity $\varepsilon_{eff,sh}$ is then much lower than the configuration without the movable shields 185. For example, under following assumption, $\varepsilon_{chuck}=0.9$, $\varepsilon_{base}=0.9$, $\varepsilon_{shield}=0.1$, the effective emissivity when the shield is closed is given by:

$$\varepsilon_{eff,closed\ shield} = \cfrac{1}{\cfrac{1}{\varepsilon_{chuck}} + \cfrac{1}{\varepsilon_{base}} + \cfrac{2}{\varepsilon_{shield}} - 2} = 0.049 \qquad (4)$$

This presents a low emissivity configuration.

When in the open position, shown in FIG. 3B, the heat radiated by the electrostatic chuck may travel directly to the top surface of the base 180. This is because the thickness of the movable shields 185 is much smaller than the width of the shields. In some embodiments, in the open position, the movable shields 185 may be rotated so that the top surface of the movable shields 185 is perpendicular to the bottom surface of the electrostatic chuck 100. This configuration minimizes the effect that the movable shields 185 have on the heat transfer between the electrostatic chuck 100 and the base 180. Of course, in other embodiments, the movable shields 185 may rotate less than 90°. In the open position, more than 80% of the heat radiated by the electrostatic chuck may travel directly to the top surface of the base 180 from the chuck. In other embodiments, more than 90% of the heat travels directly to the top surface of the base 180.

In this configuration, the base 180 may be coated with a high emissivity coating. Assuming the same emissivities given above, the effective emissivity may be given by:

$$\varepsilon_{eff,open\ shield} = \cfrac{1}{\cfrac{1}{\varepsilon_{chuck}} + \cfrac{1}{\varepsilon_{base}} - 1} = 0.818$$

This would present a high emissivity configuration.

Of course, other emissivities may be utilized. For example, if the high emissivity coating on the base has an emissivity of 0.5, the emissivity would be 0.047 when the shield is closed and 0.473 when the shield is open. In some embodiments, the emissivity of the top surface of the base 180 is greater than the emissivity of the movable shields 185.

Thus, in certain embodiments, a material having an emissivity different from the base 180 may be applied to the top surface of the base 180. For example, a high emissivity coating 181, such as those described with respect to FIG. 1, may be applied to the top surface of the base 180. Alternatively, an electrochromic material 182, such as those described with respect to FIG. 2, may applied to the top surface.

The embodiments of FIGS. 2-3 allow for the rate of heat transfer from the chuck to be adaptive.

For example, assume that an ion beam having a low power level is to be utilized. A low power level is defined as a power level at which the electrostatic chuck 100 is able to dissipate the heat through radiative heating faster than the ion beam transfers heat to the chuck. In these embodiments, the heaters 130 in the chuck are used to maintain the elevated temperature of the electrostatic chuck 100. In some embodiments, a low power beam may denote a beam power less than 100 W. A high power level is defined as a power level where, in traditional chucks, the thermal energy supplied by the ion beam cannot be dissipated by the chuck, resulting in thermal runaway. In some embodiments, a high power level is defined as a beam power greater than 100 W. In other embodiments, the high power level may be defined as greater than 500 W. In yet other embodiments, the high power level may be greater than 1000 W.

In the embodiment of FIG. 2, the controller 190 may control the electrochromic power supply 183 so as to set the transmissivity of the electrochromic material 182 to a first value. This first value may be nearly 100%. In this mode, the electrochromic material 182 is nearly transparent and therefore the system operates similar to one where the electrochromic material 182 is not utilized. When an ion beam of high power level is employed, the controller 190 may control the electrochromic power supply 183 so as to set the transmissivity of the electrochromic material 182 to a second value, which is lower than the first value, such as less than 70%. Since the emissivity of the electrochromic material 182 is higher than that of the base 180, more heat from the electrostatic chuck is transferred when a high power ion beam is used.

A similar technique may be applied to the embodiment in FIGS. 3A-3B. When an ion beam of low power level is employed, the controller 190 may control the pivoting motor 186 so as to close the movable shields 185. This causes heat to be reflected back toward the electrostatic chuck 100. When an ion beam of high power level is used, the controller 190 may control the pivoting motor 186 so as to move the movable shields 185 to the open position. In this position, heat may be reflected from the bottom surface of the shields to the base 180, and may be transferred directly to the base 180 as well. This increases the heat transfer between the electrostatic chuck 100 and the base 180 when a high power ion beam is used.

The embodiments described above in the present application may have many advantages. In one simulation, the emissivity of the base 180 was increased from 0.2 to 0.8. The maximum ion beam current that can be implanted without causing thermal runaway was increased by 50%. This simulation was validated by testing, where a high emissivity coating was applied to the base 180. As predicted, the maximum ion beam current without causing thermal runaway increased 50%. By increasing the maximum allowable ion beam current, the throughput of the implantation system may be increased. Further, the ability of adaptive change the rate of heat transfer, as shown in FIGS. 2-3, allows the same chuck and base combination to be used for ion beams having both low power levels and high power levels.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A system for mounting and heating a workpiece, comprising:
an electrostatic chuck; and
a base, separate from the electrostatic chuck by a gap of between 0.5 mm and 50 mm;
wherein a material having an emissivity different from the base is disposed on a top surface of the base and is separate from the electrostatic chuck, such that heat transfer between the electrostatic chuck and the base is achieved via radiative heating.

2. The system of claim 1, wherein the material comprises a high emissivity coating.

3. The system of claim 2, wherein the high emissivity coating has an emissivity of 0.4 or greater.

4. The system of claim 2, wherein the high emissivity coating has an emissivity of 0.6 or greater.

5. The system of claim 2, wherein the high emissivity coating comprises at least one of anodized aluminum, anodized titanium, SiC, alumina, graphite, silicon, silicon dioxide, nichrome, and ceramic coatings.

6. The system of claim 1, wherein the material comprises an electrochromic material.

7. The system of claim 6, wherein the electrochromic material comprises an electrochromic glass.

8. The system of claim 7, wherein the electrochromic glass has a transmissivity that changes by at least 30%, depending on a voltage applied to the electrochromic glass.

9. A system for mounting and heating a workpiece, comprising:
an electrostatic chuck;
a base, separate from the electrostatic chuck, wherein an electrochromic material is disposed on a top surface of the base;
a controller configured to modify an amount of heat transfer between the electrostatic chuck and the base, based on a power level of an incoming ion beam;
and an electrochromic power supply in communication with the electrochromic material and the controller, wherein the controller controls a voltage supplied to the electrochromic material by the electrochromic power supply.

10. The system of claim 9, wherein an emissivity of the electrochromic material is greater than the emissivity of the top surface of the base.

11. The system of claim 9, wherein a transmissivity of the electrochromic material is at a first value when a low power ion beam is used and a second value, lower than the first value, when a high power ion beam is used.

12. The system of claim 11, wherein, when the transmissivity is the second value, the amount of heat transfer between the electrostatic chuck and the base is greater than the amount of heat transfer when the transmissivity is the first value.

13. A system for mounting and heating a workpiece, comprising:
an electrostatic chuck;
a base, separate from the electrostatic chuck; and
a controller configured to modify an amount of heat transfer between the electrostatic chuck and the base, based on a power level of an incoming ion beam; and
movable shields disposed between the electrostatic chuck and the base.

14. The system of claim 13, wherein a top surface of the base is coated with a high emissivity material, having an emissivity of 0.4 or more.

15. The system of claim 14, wherein the movable shields are made of a material having an emissivity less than the emissivity of the high emissivity material.

16. The system of claim 13, wherein the movable shields are in a closed position when a low power ion beam is used and in an open position when a high power ion beam is used, wherein in the closed position, the movable shields are positioned such that a top surface of the movable shields is parallel to a bottom surface of the electrostatic chuck.

17. The system of claim 13, wherein the movable shields are in a closed position when a low power ion beam is used and in an open position when a high power ion beam is used, wherein in the closed position, the movable shields are positioned such that more than 80% of heat radiated by the electrostatic chuck is blocked by the movable shields so the heat does not travel directly to a top surface of the base from the electrostatic chuck.

* * * * *